(12) United States Patent
Chen et al.

(10) Patent No.: US 7,549,568 B1
(45) Date of Patent: Jun. 23, 2009

(54) METHOD OF FORMING IDENTIFICATION CODE FOR WIRE-BONDING MACHINES

(75) Inventors: Chin-Ti Chen, Hsinchu (TW); Chin-Fa Wang, Hsinchu (TW); Bing-Shun Yu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/052,426

(22) Filed: Mar. 20, 2008

(51) Int. Cl.
*B23K 31/00* (2006.01)

(52) U.S. Cl. .................. 228/180.5; 438/617; 257/784

(58) Field of Classification Search ............. 228/180.5; 438/617, 11, 15, 108, 611, 612; 257/778, 257/784, 785, 797
See application file for complete search history.

(56) References Cited

U.S. PATENT DOCUMENTS 6,008,532 A * 12/1999 Carichner ................ 257/691
2007/0241466 A1 * 10/2007 Chou et al. ................ 257/797

* cited by examiner

*Primary Examiner*—Jessica L Ward
*Assistant Examiner*—Kevin E Yoon
(74) *Attorney, Agent, or Firm*—Muncy, Geissler, Olds & Lowe, PLLC

(57) ABSTRACT

A method of forming an identification code for wire bonders is revealed. Firstly, a chip with a plurality of bonding pads is provided and is disposed on a chip carrier with a plurality of bonding fingers. A binary-code baseline is defined on the chip carrier to divide each of the bonding fingers into a first coding area adjacent the bonding pads and a second coding area far away from the bonding pads. Then, a plurality of bonding wires are formed by wire bonding to electrically connect the bonding pads to the bonding fingers and an ID code for wire bonders is formed at the same time where each bonding wire has an end selectively bonded to either the first coding area or the second coding area of the corresponding bonding finger to form an ID code for wire bonders. Since the ID code for wire bonders is constituted by the selected locations of the ends of the bonding wires, the ID code do not get lost or damaged during packaging processes nor contaminate the packages. The ID code for wire bonders can be used to easily and quickly track malfunction wire bonders to save the identification time.

10 Claims, 4 Drawing Sheets

| Wire Bonder No. | | Lead No. | | | | |
|---|---|---|---|---|---|---|
| | ........ | 44 | 45 | 46 | 47 | 48 |
| 0 | ........ | 0 | 0 | 0 | 0 | 0 |
| 1 | ........ | 0 | 0 | 0 | 0 | 1 |
| 2 | ........ | 0 | 0 | 0 | 1 | 0 |
| 3 | ........ | 0 | 0 | 0 | 1 | 1 |
| 4 | ........ | 0 | 0 | 1 | 0 | 0 |
| 5 | ........ | 0 | 0 | 1 | 0 | 1 |
| 6 | ........ | 0 | 0 | 1 | 1 | 0 |
| 7 | ........ | 0 | 0 | 1 | 1 | 1 |
| 8 | ........ | 0 | 1 | 0 | 0 | 0 |
| 9 | ........ | 0 | 1 | 0 | 0 | 1 |
| 10 | ........ | 0 | 1 | 0 | 1 | 0 |
| 11 | ........ | 0 | 1 | 0 | 1 | 1 |
| 12 ⋮ | ⋮ | ⋮ | ⋮ | ⋮ | ⋮ | ⋮ |

FIG. 4

METHOD OF FORMING IDENTIFICATION CODE FOR WIRE-BONDING MACHINES

FIELD OF THE INVENTION

The present invention relates to identification codes (ID codes), especially to a method of forming an identification code for wire bonders during semiconductor packaging processes.

BACKGROUND OF THE INVENTION

IC chips are electrically connected to the chip carriers to perform the required functions. Wire bonding (WB), tape automated bonding (TAB), and flip chip (FC) are the major electrical connections for the existing electronic packages. However, wire bonding is still the major electrical connections between the chip and the chip carrier in semiconductor packages. A substrate or a lead frame is used as a chip carrier to be external electrical connection media for IC chips. The bonding pads of a chip are electrically connected to the bonding fingers of a substrate or a lead frame by bonding wires formed by wire bonding technology to achieve electrical connections of IC chips.

Wire bonders are widely implemented in semiconductor packaging houses with numerous numbers. According to known researches, the equipment ratio of wafer saw machines, die bonders, and wire bonders is 1 to 4 to 16. Moreover, wire bonding is performed in automatic or semi-automatic. In the conventional wire bonding processes, once a wire bonder has wrong setting parameters causing poor bonding wires or fake bonding, it is very difficult to pin point out the malfunction wire bonder manually and quickly. If the malfunction wire bonder can not be found quickly, more bonding wires are wrongly wire bonded leading to more loss in materials, in packaging yields, and in scrapped packages. Therefore, it is very important to develop a set of methodology to quickly identify malfunction wire bonders. If barcodes or any foreign ID tags are stuck to the chip carriers, the barcodes or foreign IC tags will be easily lost or damaged during packaging processes, or contaminated the packages.

SUMMARY OF THE INVENTION

The main purpose of the present invention is to provide a method of forming an identification codes (ID code) for wire bonders by setting a binary-barcode baseline on the chip carrier. The ID code for wire bonders is formed by a plurality of bonding wires with different wire lengths overpassing or not overpassing the binary-barcode baseline so that it is easy and quick to track malfunction wire bonders to save identification time to avoid more wrongly bonded bonding wires leading to less waste of materials, better packaging yields, and fewer scrapped packages. Additionally, the ID code for wire bonders does not get lost nor damaged during packaging processes nor contaminated the packages.

The second purpose of the present invention is to provide a method of forming an identification code for wire bonders by integrating the formation of ID code for wire bonders into wire bonding processes. It is easy and quick to identify malfunction wire bonders without extra processing steps, without contaminating the packages nor affecting packaging yields.

According to the present invention, a method of forming an identification code for wire bonders is revealed. Firstly, a chip is provided where the chip has a plurality of bonding pads. Then, the chip is disposed on a chip carrier where the chip carrier has a plurality of bonding fingers. Then, a binary-code baseline is defined on the chip carrier to divide each of the bonding fingers into a first coding area adjacent the bonding pads and a second coding area far away from the bonding pads. A plurality of bonding wires are formed by wire-bonding to electrically connect the bonding pads to the bonding fingers, at the same time, an ID code for wire bonders is formed. Therein, each bonding wire has an end selectively bonded to either the first coding area or the second coding area of the corresponding bonding finger but not both, wherein the ID code is constituted by the selected locations of the ends of the bonding wires.

DESCRIPTION OF THE DRAWINGS

FIG. 4 shows a partial table to count the ID code for wire bonders from the corresponding lead numbers according to the preferred embodiment of the present invention.

DETAIL DESCRIPTION OF THE INVENTION

Please refer to the attached drawings, the present invention will be described by means of embodiment below.

A method of forming an identification code for wire bonders is revealed in the preferred embodiment of the present invention, primarily comprising the following processing steps: step 11 of "providing a chip", step 12 of "disposing the chip to a chip carrier", step 13 of "setting a binary-barcode baseline on the chip carrier", and step 14 of "forming a plurality of bonding wires at the same time of forming an ID code for wire bonders by wire bonding".

Figure 1:
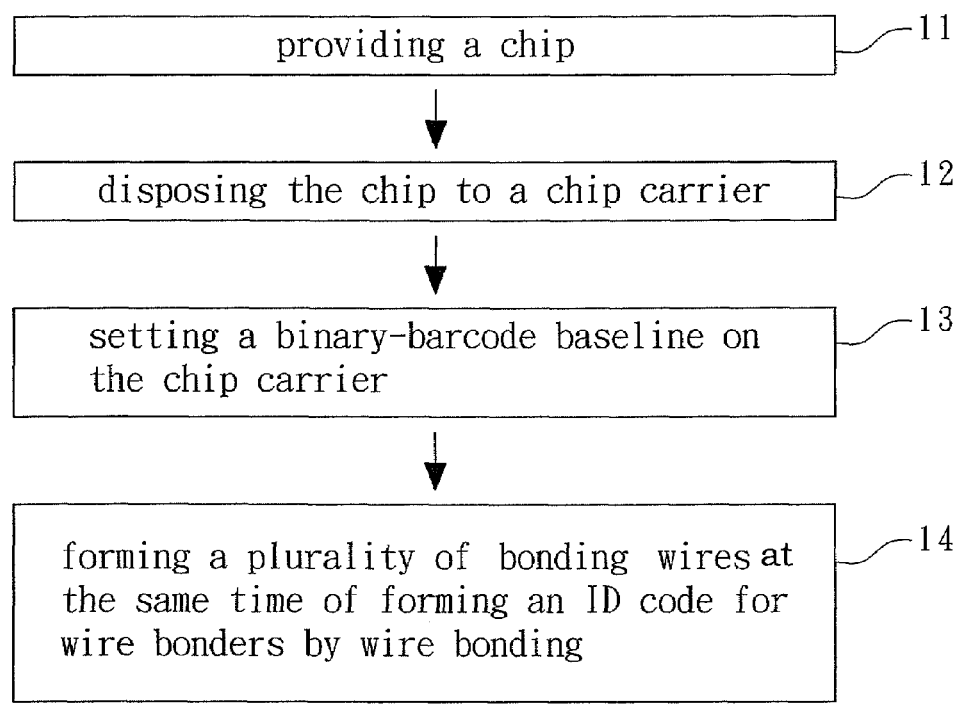
FIG. 1 shows a flow chart of a method of forming an identification code for wire bonders according to the preferred embodiment of the present invention.
Figure 2:
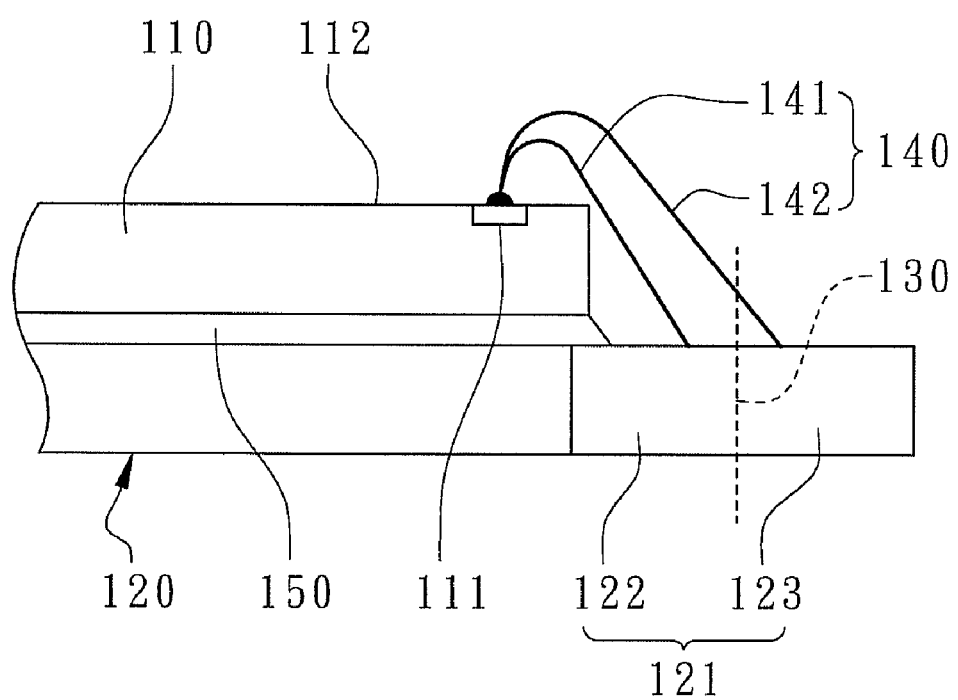
FIG. 2 shows a partial cross-sectional view of a chip carrier with a chip after wire-bonding utilizing the method of forming an ID code according to the preferred embodiment of the present invention.
Figure 3:
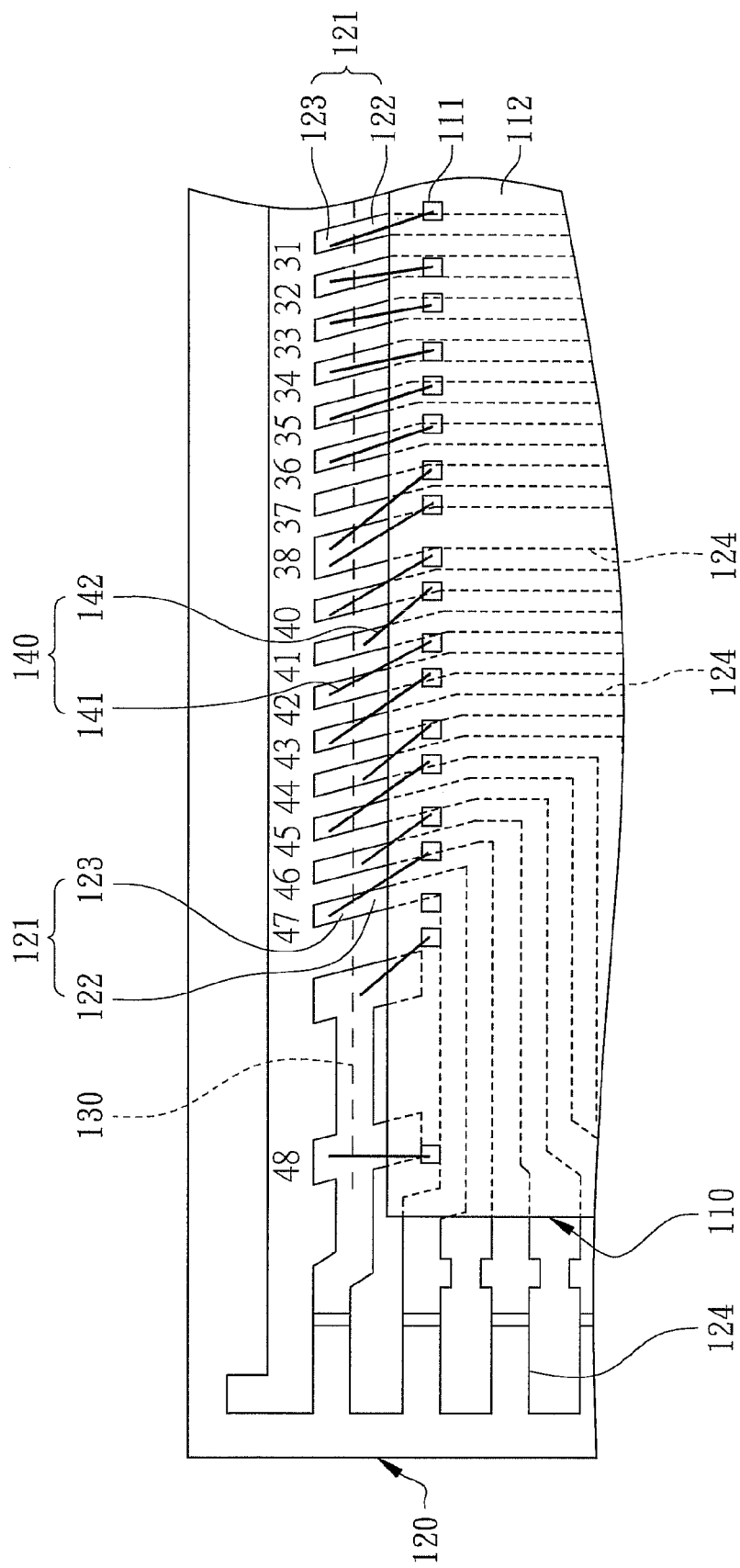
FIG. 3 shows a partial top view of the chip carrier with the chip after wire-bonding according to the preferred embodiment of the present invention.

Firstly, step 11 of "providing a chip" is performed. As shown in FIG. 2 and FIG. 3, the provided chip 110 has an active surface 112 with a plurality of bonding pads 111 disposed on the active surface 112 as external electrodes of the chip 110. The bonding pads 111 may be arranged at peripheries of the active surface 112 of the chip 110 such as two opposing sides or four sides. The material of the chip 210 can be Si, GaAs, or other semiconductor materials.

Then, step 12 is performed so that the chip 110 is disposed on a top surface of a chip carrier 120, as shown in FIG. 2. In the present embodiment, the chip 110 is attached to the top surface of the chip carrier 120 by a die-attaching paste 150 such as B-stage paste, adhesive films, epoxy, non-conductive paste, or liquid paste. As shown in FIG. 3, the chip carrier 120 has a plurality of bonding fingers 121. Each bonding finger 121 has a number which can be recognized by the wire bonder, such as numbers 31-48 as shown in FIG. 3. In the present embodiment, the chip carrier 120 is a metal lead frame having a plurality of conductive leads 124 where the bonding fingers 121 are formed at the internal ends of the leads 124. The bonding fingers 121 are disposed at the peripheries of the chip 110 for electrical connections to the bonding pads 111. As shown in FIG. 3, at least one of the leads 121 is in the shape of "T" or a cross such as lead number 48. In other preferred embodiment, the chip carrier 120 can be a substrate, a printed circuit board, a circuit thin film, or other chip carriers including insulating materials.

In the step 13, as shown in FIG. 2 and FIG. 3, a binary-barcode baseline 130 is defined on chip carrier 120 to divide each of the bonding fingers 121 into a first coding area 122 adjacent the bonding pads 111 and a second coding area 123 far away from the bonding pads 111. To be more specific, the binary-barcode baseline 130 can be a fictitious straight line which can be recognized by the wire bonder or a real straight line disposed on the chip carrier by etching or by deposition. Preferably, the binary-barcode baseline 130 can evenly divide the bonding fingers 121, i.e., the binary-barcode baseline 130 is disposed at the center of the bonding fingers 121 so that the first coding area 122 and the second coding area 123 of each bonding finger 121 are equal in dimensions for easily wire bonding. The location of the binary-barcode baseline 130 is not limited at the center of the bonding fingers 121 but can be adjusted by a ratio to define the first coding area 122 and the second coding area 123 by requirements.

Next, the step 14 includes a wire-bonding step. At the same time, an ID code for wire bonders is formed to verify a utilized wire bonder in the wire-bonding step to electrically connect the chip 110 to the chip carrier 120. As shown in FIG. 2 and FIG. 3, a plurality of bonding wires 140 are formed by wire bonding. The bonding pads 111 are electrically connected to the bonding fingers 121 of the chip carrier 120 by the bonding wires 140. Each bonding wire 140 has an end on the corresponding bonding finger 121, which is selectively bonded to either the first coding area 122 or the second coding area 123 of the corresponding bonding finger 121 but not both. A series of locations of the ends of the bonding fingers 121 constitutes the ID code for wire bonders. To be more specific, the bonding wires 140 forming the ID code are of uneven lengths. Normally, the bonding wires 140 include at least a long bonding wire 141 bonded to the second coding area 123, which is long enough to overpass the binary-barcode baseline 130 to represent a code symbol of "1". On the contrary, the bonding wires 140 include at least a short bonding wire 142 bonded to the first coding area 122, which is short enough not to overpass the binary-barcode baseline 130 to represent a code symbol of "0". Alternatively, the code definition mentioned above can be changed to the contrary. The long bonding wire 141 overpassing the binary-barcode baseline 130 and bonded to the second coding area 123 can be recognized as "0" and the short bonding wire 142 without overpassing the binary-barcode baseline 130 and bonded to the first coding area 122 to be recognized as "1".

Accordingly, each wire bonder has an ID code where the ID code can be implemented in the wire-bonding on chip carrier 120 during semiconductor packaging processes. The formation of the ID code for wire bonders is implemented in the wire bonding processes without extra steps to stick barcodes or external ID tags. In the present embodiment, as shown in FIG. 3 and FIG. 4, if the ID code for wire bonders is No. 1, a long bonding wire 141 is bonded on the No. 48 lead 124 to represent "1" where the rest of the leads 124 are bonded with short bonding wires 142 to represent "0" to form the ID code "1" to represent No. 1 wire bonder disclosing that the bonding wires 140 of the chip carrier 120 are formed by wire bonder No. 1. Additionally, the amount of the short bonding wires 142 is more than the one of the long bonding wire 141. Another example as shown in FIG. 3, one of the bonding wires 140 bonded on No. 48 lead is a long bonding wire 141 to represent "1". The bonding wire 140 bonded on No. 47 lead is another long bonding wire 141 to represent "1". The bonding wire 140 bonded on No. 46 lead is a short bonding wire 142 to represent "0". The bonding wire 140 bonded on No. 45 lead is a long bonding wire 141 to represent "1". The bonding wire 140 bonded on No. 44 lead is a short bonding wire 142 to represent "0". Therefore, the binary ID code for wire bonders is "01011". In the binary-code system, two bits are the basic calculation units with only "0" and "1" such as "01" representing number 1, "10" representing number 2, and "11" representing number 3. Every "2" has to carry the number into next digit. In order to convert a binary number into a decimal number, each number has to multiply by its weight. When converting a binary number into a decimal number, the weight of each digit has to be calculated first. For example, when the binary number "1001" is converted into a decimal number, each digit from right to left represents, 2 to the zero order, 2 to the first order, 2 to the second order and 2 to the third order. By multiplying by the weight of each digit, the sum is $1\times(2^3)+0\times(2^2)+0\times(2^1)+1\times(2^0)=8+0+0+1=9$. Therefore, the ID code for wire bonders "1001" is nine, which means that the bonding wires 140 on the chip carrier 120 are formed by No. 9 wire bonder. After implemented the present invention, for another example, if one binary ID code for wire bonders is "01011" mentioned above, the sum is $0\times(2^4)+1\times(2^3)+0\times(2^2)+1\times(2^1)+1\times(2^0)=0+8+0+2+1=11$. Therefore, the ID code for wire bonder is eleven, which means that the bonding wires 140 of the chip carrier 120 are formed by No. 11 wire bonder. All the other ID code for wire bonders can be derived in the same methodology. If the total lead count of the leads 124 is forty eight, all the forty eight leads 124 can be used as ID code with total ID code of 2 to the 48th order minus one which is more than enough to identify huge numbers of wire bonders.

Therefore, the ID code for wire bonders is formed on the chip carrier 120 with the chip 110 during wire bonding processes. From the pattern consisting of the locations of the ends of the bonding wires with different wire lengths on the chip carrier, the number of the wire bonder utilized in the wire bonding step 14 can be identified. When the wire-bonding quality went poor, the malfunction wire bonder can be quickly identified by the ID code for wire bonders to stop the wire bonding processes first and then to maintain or repair the malfunction wire bonder to avoid more wrongly bonded bonding wires and to ensure better wire-bonding yields.

The above description of embodiments of this invention is intended to be illustrative and not limiting. Other embodiments of this invention will be obvious to those skilled in the art in view of the above disclosure.

What is claimed is:

1. A method of forming an identification code for wire bonders, comprising the steps of:
   providing a chip having a plurality of bonding pads;
   securing the chip to a chip carrier, wherein the chip carrier has a plurality of bonding fingers;
   dividing each of the bonding fingers by a baseline into a first coding area adjacent the bonding pads and a second coding area further away form the bonding pads than the first coding area;
   wire-bonding a plurality of bonding wires to electrically connect the bonding pads to the bonding fingers, one end of each bonding wire being bonded to a bonding finger and selectively bonded to either the first coding area or the second coding area of that bonding finger but not both;
   acquiring a code value for each bonding wire based on the location of the bonding of the end of the bonding wire to either the first or second coding area;
   forming an identification code for wire bonders using the code values of the bonding wires.

2. The method as claimed in claim 1, wherein the bonding wires forming the ID code are of uneven lengths.

3. The method as claimed in claim 1, wherein at least one of the bonding wires bonded to the second coding area is long enough to overpass the binary code baseline to represent a code symbol of "1".

4. The method as claimed in claim 3, wherein at least one of the bonding wires bonded to the first coding area is short enough not to overpass the binary code baseline to represent a code symbol of "0".

5. The method as claimed in claim 1, wherein the binary code baseline is a straight line.

6. The method as claimed in claim 1, wherein the chip carrier is a lead frame having a plurality of leads, and wherein the bonding fingers are formed at the internal ends of the leads.

7. The method as claimed in claim 1, wherein the chip carrier is a substrate.

8. The method as claimed in claim 1, wherein the binary code baseline evenly divides the bonding fingers so that the first coding area and the second coding area of each bonding finger are equal in dimensions.

9. The method as claimed in claim 1, wherein at least one of the leads is in the shape of "T".

10. The method as claimed in claim 1, wherein at least one of the leads is in the shape of a cross.

* * * * *